United States Patent [19]

Sasaki

[11] Patent Number: 5,447,877
[45] Date of Patent: Sep. 5, 1995

[54] METHOD OF MANUFACTURING NONVOLATILE SEMICONDUCTOR MEMORY DEVICE

[75] Inventor: Hiroyuki Sasaki, Yokohama, Japan

[73] Assignee: Kabushiki Kaisha Toshiba, Kawasaki, Japan

[21] Appl. No.: 133,985

[22] Filed: Oct. 8, 1993

[30] Foreign Application Priority Data

Oct. 12, 1992 [JP] Japan .................................. 4-298227

[51] Int. Cl.6 .................. H01L 21/266; H01L 21/8247
[52] U.S. Cl. ........................................ 437/43; 437/48; 437/52; 437/984
[58] Field of Search .................. 437/43, 49, 48, 52, 437/984; 257/316

[56] References Cited

U.S. PATENT DOCUMENTS

| 5,240,870 | 8/1993 | Bergemont | 437/43 |
| 5,246,874 | 9/1993 | Bergemont | 437/52 |
| 5,268,318 | 12/1993 | Harari | 437/43 |
| 5,279,982 | 1/1994 | Crotti | 437/48 |
| 5,284,784 | 2/1994 | Manley | 437/43 |
| 5,290,721 | 3/1994 | Yoshimi et al. | 437/43 |

Primary Examiner—Olik Chaudhuri
Assistant Examiner—Richard A. Booth
Attorney, Agent, or Firm—Finnegan, Henderson, Farabow, Garrett & Dunner

[57] ABSTRACT

A plurality of memory cells are formed on a semiconductor substrate. Each memory cell contains a first gate insulating film formed on the semiconductor substrate, a floating gate formed on the first gate insulating film, a second gate insulating film formed on the floating gate, a control gate formed on the second gate insulating film, and a source and a drain region formed in the semiconductor substrate on both sides of the floating gate, respectively. The source regions of the memory cells are connected with a plurality of common source lines. At least the surface of these source regions in the vicinity of the ends of the floating gate are made flush with the surface of the semiconductor substrate under the floating gate.

9 Claims, 7 Drawing Sheets

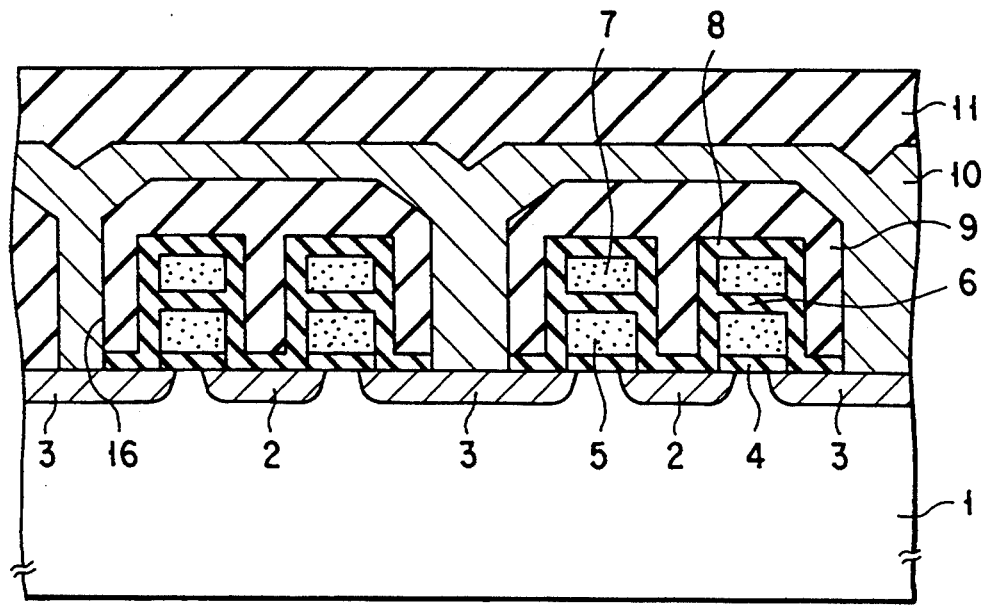
F I G. 1
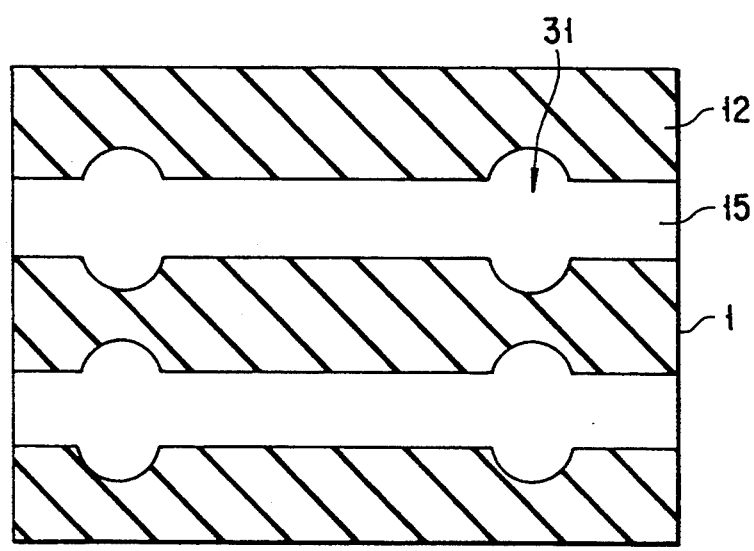
F I G. 2

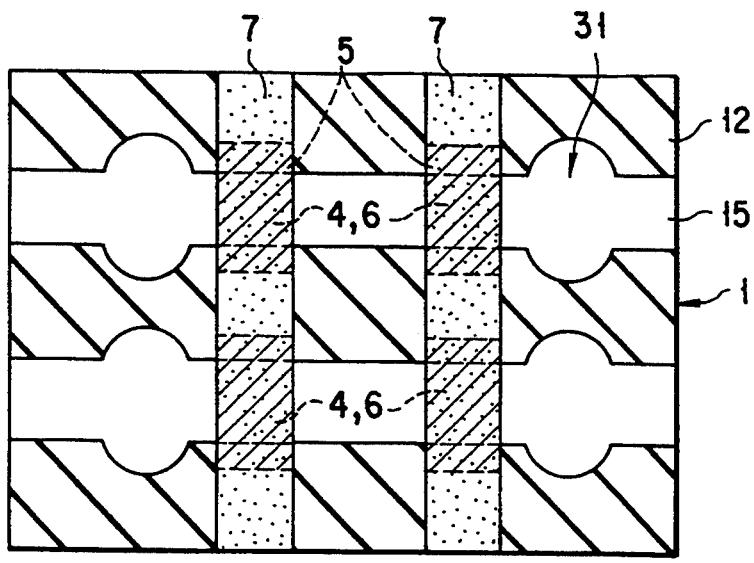
F I G. 3
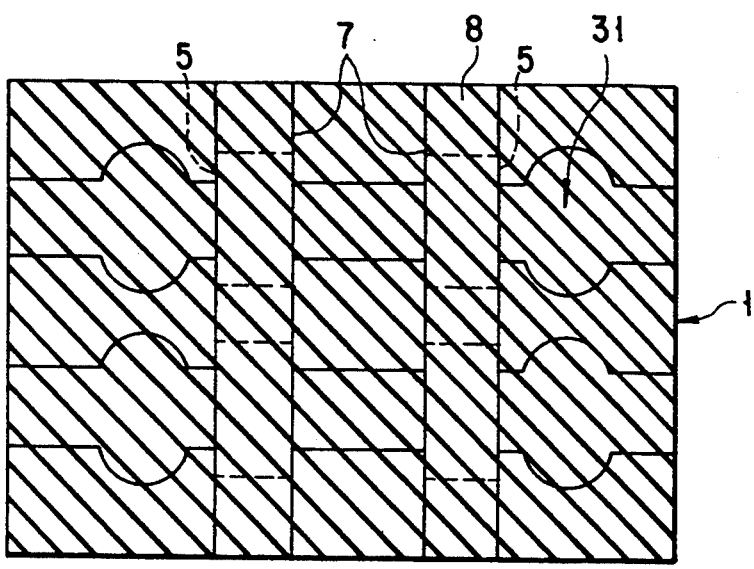
F I G. 4
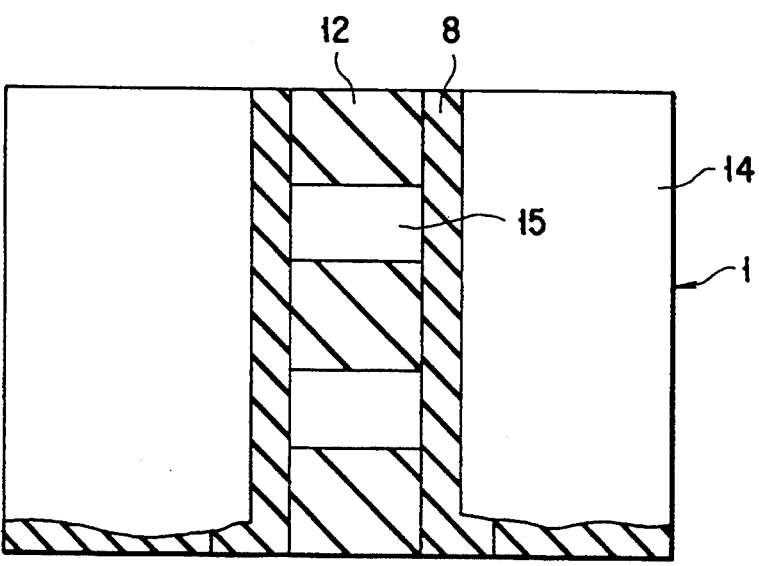
F I G. 5

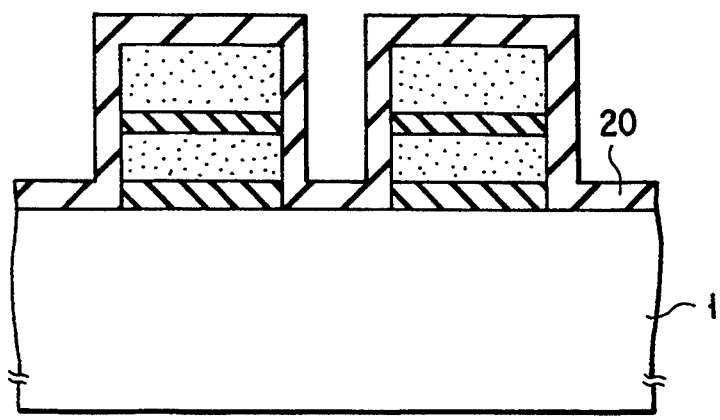
F I G. 11
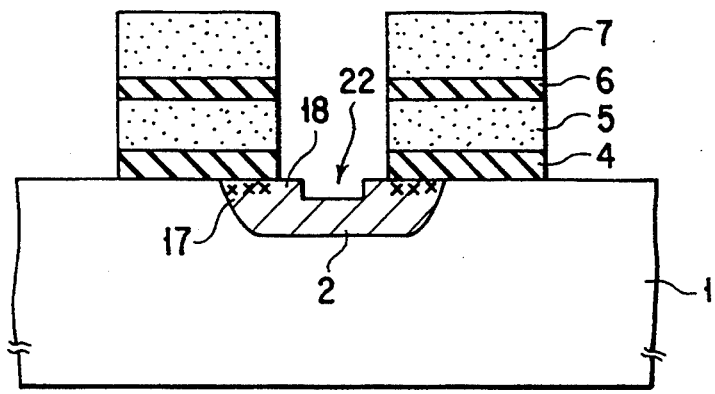
F I G. 12

METHOD OF MANUFACTURING NONVOLATILE SEMICONDUCTOR MEMORY DEVICE

BACKGROUND OF THE INVENTION

1. Field of the Invention

This invention relates to a nonvolatile semiconductor memory device with improved source diffused regions, which is applied to, for example, a PROM (Programmable Read Only Memory) or an EEPROM (Electrically Erasable and Programmable ROM), and a manufacturing method thereof.

2. Description of the Related Art

For example, PROMs, which allow the stored data to be erased by ultraviolet rays, and EEPROMs, which allow the stored data to be erased electrically, are capable of retaining the stored data almost indefinitely. Because these memories enable the stored data to be erased or rewritten, they have been used widely as firmware for a system where the modification of programs is expected, a system where a program is constructed, taking into account compatibility with other systems, or a system for allowing the positive change of program specifications. Especially, flash EEPROMs capable of erasing the stored data in unison are widely used as program memorizes for microcomputers.

FIG. 13 is a sectional view of a conventional flash EEPROM. A first gate insulating film 4 is formed on a semiconductor substrate 1 made of, for example, p-type polysilicon. On the first gate insulating film 4, a floating gate 5 made of, for example, polysilicon is formed. On the floating gate 5 is formed a second gate insulating film 6, on which a control gate 7 made of, for example, polysilicon is formed to complete a floating-gate transistor. The control gate 7 constitutes a word line. A multi-layer structure of the floating gate 5 and control gate 7 is covered with a thermal oxide film 8, on which an interlayer insulating film 9 of, for example, SiO$_2$ is deposited. In the semiconductor substrate 1 between the multilayer gate structures, n-type impurities are diffused so as to form source regions 2 and drain regions 3 one after another alternately. A contact hole 16 is made in the interlayer insulating film 9. In the contact hole 16, the drain region 3 is exposed. After this, a wire 10 is formed of metal, such as Al, on the interlayer insulating film 9 to provide a bit line. The wire 10 is connected to the drain region through the contact hole 16. On the wire 10, a passivation film 11, such as a PSG (Phosphor Silicate Glass) film, is deposited.

FIG. 14 is a NOR nonvolatile semiconductor memory where memory cells of the above-described structure are arranged in a matrix. In FIG. 14, the same parts as those in FIG. 13 are indicated by the same reference characters. The drain 3 of each memory cell is connected to bit lines B0, B1, B2, and B3, respectively. The sources 2 of the individual memory cells are grounded via each common source line 21. Each control gate 7 is connected to word lines W0, W1, and W3, respectively.

Referring to FIG. 15, the operation of the flash EEPROM will be explained. In FIG. 15, the same parts as those in FIG. 13 are shown by the same reference characters.

To write data in a memory cell, electrons are injected into the floating gate 5. First, a high voltage of approximately 7 V is also applied to a drain electrode D at the same time that a high voltage of approximately 12.0 V is applied to a gate electrode G connected to the control gate 7. By biasing the memory cell this way, some of the electrons accelerated in the pinch-off region near the drain 3 act as hot electrons, which are captured at the floating gate 5. The saturation amount of captured electrons is determined by the potential of the floating gate 5. When electrons are captured by the floating gate 5, the threshold voltage Vth of the transistor controlled by the control gate 7 rises. The presence and absence of a change in the threshold voltage are caused to correspond to 1 level and 0 level, respectively.

To read the stored data from the memory cell, approximately 1.5 V is applied to drain electrode D at the same time that a voltage of approximately 5 V is applied to gate electrode G. Because the voltage of gate electrode G is as low as 5 V, hot electrons will not be injected into the floating gate 5. The transistor whose floating gate 5 is not injected with electrons turns on, allowing a read current to flow. The transistor whose floating gate 5 is injected with electrons remains off, because its threshold voltage Vth stays high.

To erase the stored data from the memory cell, the electrons in the floating gate 5 are forced to discharge into the source 2. In this case, for example, 0 V is applied to gate electrode G and a high voltage ranging from 11 V to 13 V is applied to source electrode S. At this time, when the potential difference between the floating gate 5 and source electrode S enhances the electric field applied to the first gate insulating film 4, the electrons in the floating gate 5 are discharged into the source 2 in the form of tunnel current.

As shown in FIG. 16, in a conventional nonvolatile semiconductor memory, an element-isolating field oxide film 12 is formed so as to make a curve at the boundary between itself and the source region 2 or the drain region 3. If the gates 5 and 7 are deviated to the right or the left in the figure from the proper place, the width W between transistors constituting the memory cell varies. Further, the field oxide film 12 has a region 13 projecting from gates 5 and 7 into the source region 2, which sets a limit to making the structure much finer.

To overcome this limitation, as the elements in semiconductor devices are becoming much finer, a self-aligned (SAS: Self Aligned Source) method making use of a gate in forming a source region 2 is being used more. When the SAS method is used, the source of a memory cell is formed with respect to the gate in a self-aligning manner, with the result that there is no gap between the source/drain region and the gate. Furthermore, because the field oxide film does not project into the source region, it is possible to make the elements finer.

FIG. 17 shows a case where a source region is formed on the semiconductor substrate 1 by the SAS method. As described above, the gates 5 and 7 of a memory cell are formed on the semiconductor substrate 1. After this, a photoresist 14 is coated over a portion of the gate 7 and a portion in which a drain region 3 is to be formed. Then, the field oxide film 12 in the portion which is to be the common source line 12 is removed by RIE (Reactive Ion Etching) (hereinafter, anisotropic etching on an oxide film is referred to as oxide-film RIE). At this time, because on the semiconductor substrate 1, the portion scheduled to be the source region 2 in the portion scheduled to be the common source line 21 on which the field oxide film 12 is not formed, is not coated with the photoresist 14, this portion is etched by the oxide film RIE. As a result, the portion in which the source region is to be formed is dug a little. Thus, when an EEPROM cell is completed, the surface of the source region 2 is lower than the surface of the semiconductor substrate 1 under the floating gate 5 of the memory cell and the first insulating gate 4, as shown in FIG. 13.

In an EEPROM cell with a common source line, when the surface of the source region 2 is lower than the surface of the semiconductor substrate under the floating gate 5 and the first gate insulating film 4 and steps are formed at the boundary between the two surfaces, the strength of an electric field varies at the step portions. Because of this, when in the flash EEPROM, the data is erased by causing electrons to discharge from an end of the floating gate 5 into the source region 2, the erasing cannot be effected sometimes, making it difficult to erase the data stably.

SUMMARY OF THE INVENTION

The object of the present invention is to provide a semiconductor memory device with a source region capable of assuring a stable erasing characteristic and a manufacturing method thereof.

The foregoing object is accomplished by providing a semiconductor memory device comprising: a semiconductor substrate; a plurality of memory cells formed on the semiconductor substrate, each memory cell containing a first gate insulating film formed on the semiconductor substrate, a floating gate formed on the first gate insulating film, a second gate insulating film formed on the floating gate, a control gate formed on the second gate insulating film, and a source and a drain region formed in the semiconductor substrate on both sides of the floating gate, respectively; and a plurality of common source lines containing the source regions of the memory cells, at least the surface of these source regions in the vicinity of the ends of the floating gate being made flush with the surface of the semiconductor substrate under the floating gate.

The foregoing object is also accomplished by providing a manufacturing method of semiconductor memory devices, comprising the steps of: placing a plurality of field oxide films at intervals in stripes on the surface of a semiconductor substrate so as to arrange field oxide film regions and element regions one after another alternately on the surface of the semiconductor substrate; forming a plurality of striped multilayer gate structures in a direction almost perpendicular to the field oxide film, at specified intervals above the semiconductor substrate, each multilayer gate structure having a first gate insulating film formed on the semiconductor substrate, a floating gate formed on the first gate insulating film, a second gate insulting film formed on the floating gate, and a control gate formed on the second gate insulating film, the floating gate, the second gate insulating film and the control gate being formed on the field oxide film and the element region; forming a thermal oxide film on the surface of the semiconductor substrate containing the surface of the multilayer gate structure; coating the regions except for at least a common-source line formation-scheduled area with a photoresist, the common-source line formation-scheduled area containing source regions; etching away the thermal oxide film on the source-region formation-scheduled area so as to expose the semiconductor substrate in this scheduled area; selectively growing a protective film on the surface of the semiconductor substrate exposed in the source-region formation-scheduled area, the etching rate of the protective film being lower than the etching rate of the field oxide film; etching away the protective film on the common-source line formation-scheduled area so as to expose the surface of the semiconductor substrate in this scheduled area; and implanting impurity ions into the common-source line formation-scheduled area in the semiconductor substrate, with the multilayer gate structure as a mask, so as to form common source lines containing source regions in this scheduled area in a self-aligning manner.

with the above arrangement, because the surfaces of the portions of the source region near the ends of the floating gate are made flush with the surface of the semiconductor substrate under the floating gate, the strength of electric field between the floating gate and the source region is uniform, thereby enabling the stored data to be erased stably.

Further, in the process of etching the field oxide film before the formation of the source region in a self-aligning method, an etching-resistant protective film is selectively grown on the source-region formation-scheduled area. Thus, the surfaces of the semiconductor substrate near the ends of the floating gate in the source region can be made flush with the surface of the semiconductor substrate under the floating gate.

Still further, in the process of etching the field oxide film before the formation of the source region in a self-aligning method, an insulating film is formed on the sidewall of the multilayer gate which at least the source formation-scheduled area faces. Because the thickness of this insulating film is set almost equal to that of the field oxide film, it is possible to make the surfaces of the semiconductor substrate near the ends of the floating gate in the source region flush with the surface of the semiconductor substrate under the floating gate.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of a semiconductor memory device according to a first embodiment of the present invention;

FIGS. 2 through 6 are plan views of the sequence of manufacturing processes for the semiconductor memory device of FIG. 1;

FIG. 11 is a sectional view of a semiconductor memory device according to a second embodiment of the present invention;

FIG. 12 is a sectional view of the second embodiment;

DETAILED DESCRIPTION OF THE PREFERRED EMBODIMENTS

Figure 6:
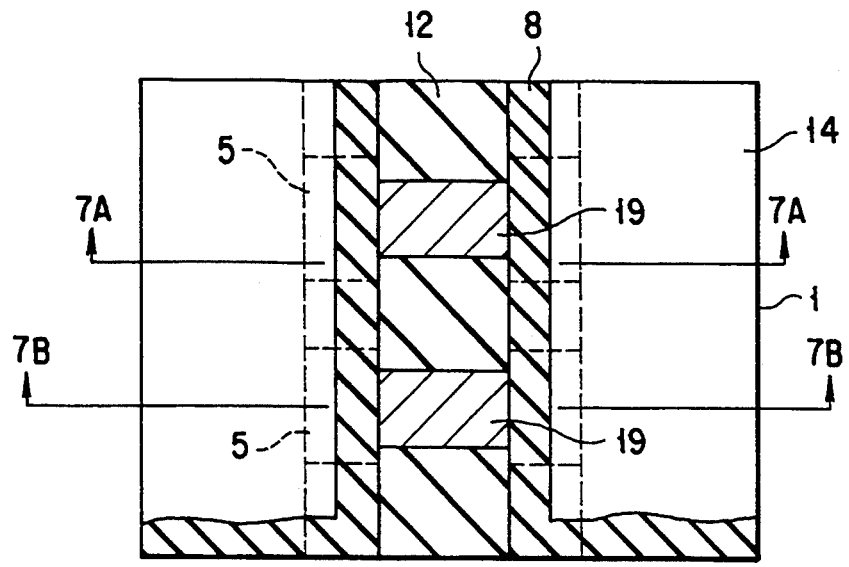

Hereinafter, referring to the accompanying drawings, embodiments of the present invention will be explained.

FIG. 1 shows a first embodiment of the present invention, where the invention is applied to, for example, a flash EEPROM cell.

A first gate insulating film 4 of $SiO_2$ approximately 100 Å thick is formed on a semiconductor substrate 1 of, for example, p-type polysilicon. On the first gate insulating film, a floating gate 5 made of, for example, polysilicon, is formed. On the floating gate 5 is formed a second gate insulating film 6 made up of, for example, a multilayer structure of a silicon oxide film and a silicon nitride film, on which a control gate 7 made of, for example, polysilicon is formed. The multilayer structure of the floating gate 5 and control gate 7 is covered with a thermal oxide film 8, on which an interlayer insulating film 9 of, for example, $SiO_2$ is deposited. In the semiconductor substrate between the multilayer gate structures, n-type impurities are diffused so as to form source regions 2 and drain regions 3 one after another alternately. A contact hole 16 is made in the interlayer insulating film 9. In the contact hole 16, the drain region 3 is exposed. After this, a wire 10 is formed of metal, such as Al, on the interlayer insulating film 9 to provide a bit line. The wire 10 is connected to the drain region through the contact hole 16. On the wire 10, a passivation film 11, such as a PSG film, is deposited.

Figure 13:
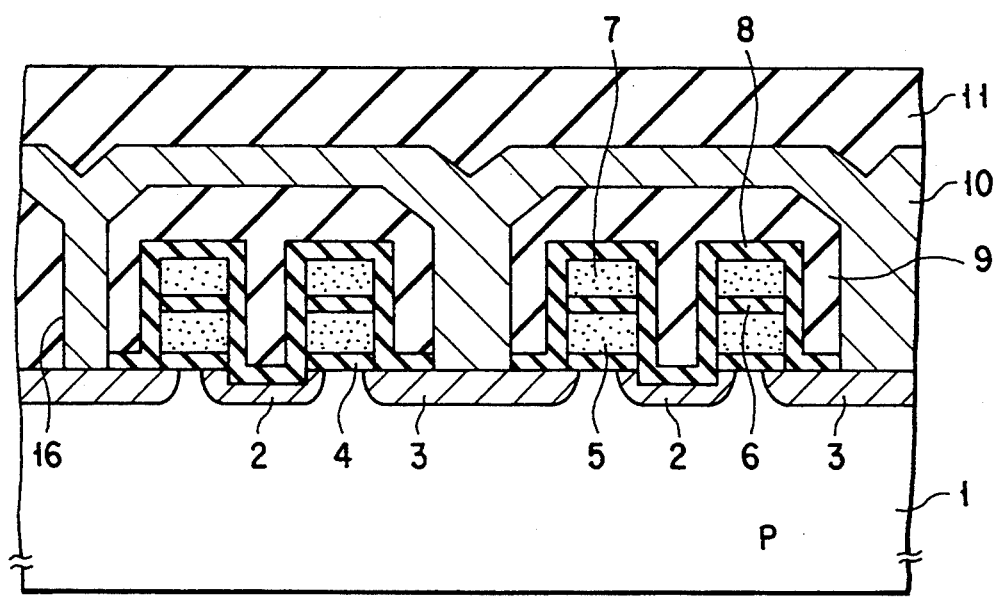
FIG. 13 is a sectional view of a conventional semiconductor memory cell.
Figure 14:
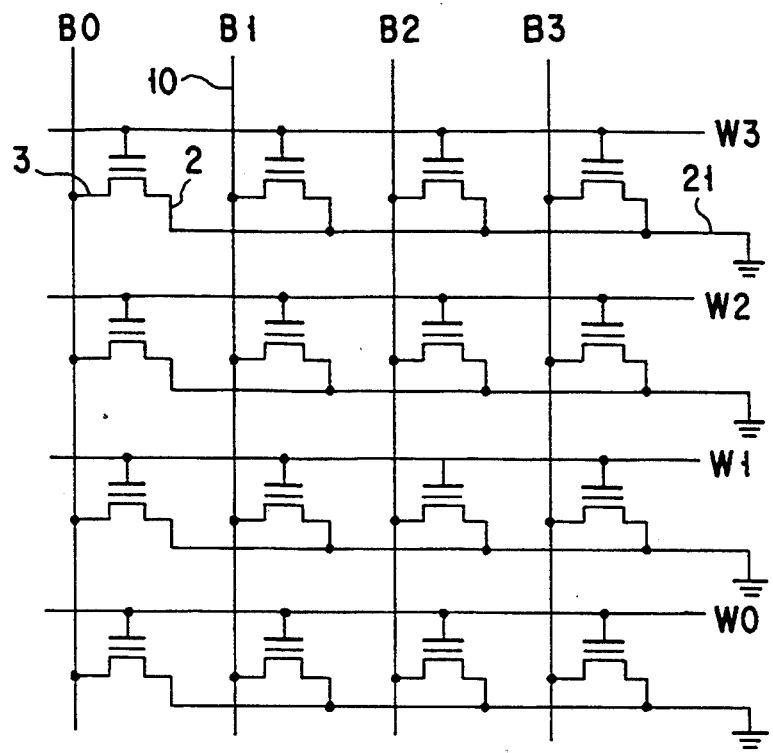
FIG. 14 is a circuit diagram of a memory cell array using the semiconductor memory cells shown in FIG. 13.
Figure 15:
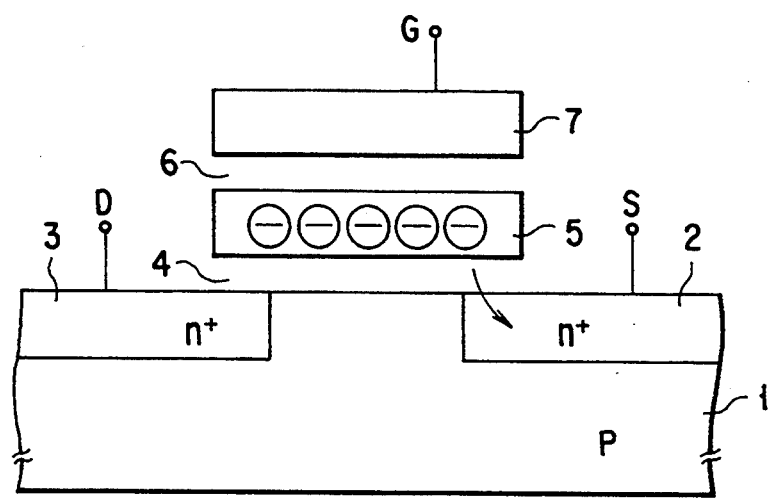
FIG. 15 is an explanatory diagram for the operation of a semiconductor memory.
Figure 16:
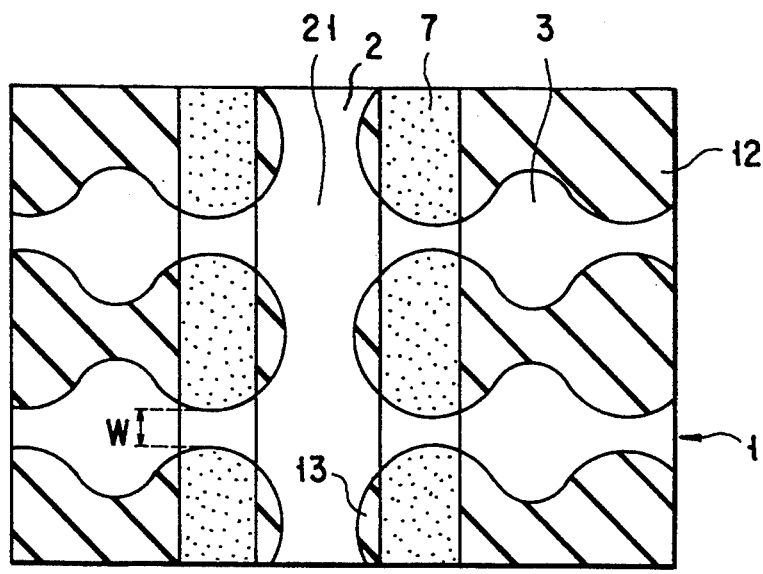
FIG. 16 is a plan view of part of manufacturing processes for conventional semiconductor memory cells.
Figure 17:
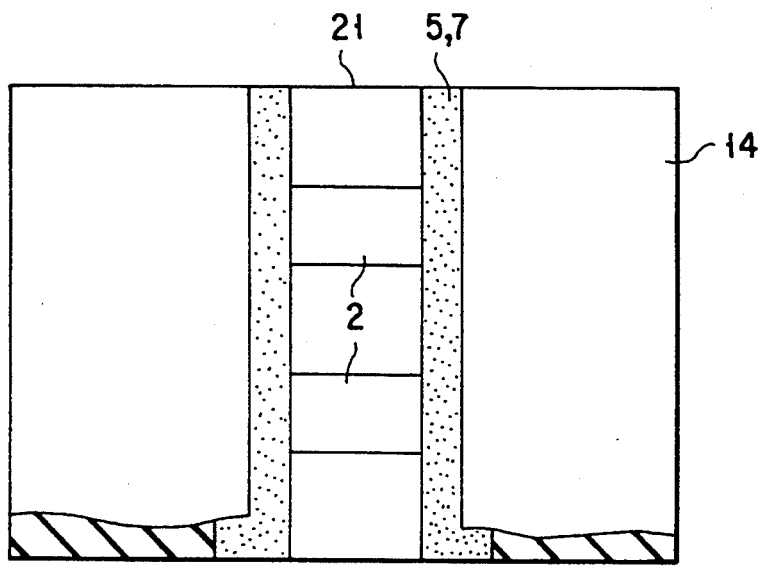
FIG. 17 is a plan view of an important part of the manufacturing processes for the semiconductor memory cells shown in FIG. 15.

The memory cells are arranged in a matrix on the semiconductor substrate 1, as shown in FIG. 13, to form the element portion of the flash EEPROM. The element portion is composed of a plurality of memory cell columns. The memory cells in each column share a gate and a source region. Thus, in the element portion, there are provided a plurality of common source lines. This configuration is the same as that of the conventional equivalent described above.

In the semiconductor memory device of this embodiment, the surface of the source region 2 is flush with the surface of the semiconductor substrate 1 under the floating gate 5 and the first gate insulating film 4, and there is no gap between these surfaces. As described above, the flash EEPROM erases the data by discharging the electrons in the floating gate 5 into the source region 2. When the surface of the source region 2 is flush with the surface of the semiconductor substrate 1 under the floating gate 5 and the first gate insulating film 4 as in this embodiment, the electric field strength at the two surfaces is uniform in discharging electrons from the floating gate 5 to the source region 2. This ensures that the data is erased completely, thereby stabilizing the erasing characteristic.

Referring to FIGS. 2 through 10, a manufacturing method of the semiconductor memory device will be described.

First, as shown in FIG. 2, a field oxide film 12 is formed into stripes on the surface of the p-type silicon semiconductor substrate 1 by LOCOS techniques so that striped element regions 15 and field oxide film regions 12 may be arranged one after another alternately. The width of the element region 15 is normally approximately 0.7 μm, and the width of the drain formation-scheduled area 31 is approximately 1.4 μm. The reason for this is that the diameter of a contact hole formed so as to correspond to the drain region is approximately 1.2 μm and the drain formation scheduled area 31 is expanded according to the contact hole. The thickness of the field oxide film 12 is approximately 6000 Å. Under the field oxide film 12, a channel stopper region (not shown) is formed. Next, on the surface of the element region 15, a dummy gate oxide film (not shown) is formed to a thickness of approximately 10 nm by thermal oxidation. This dummy gate oxide film acts as a buffer in injecting ions for threshold control.

Then, specified impurities of ions for threshold control are injected into the channel formation-scheduled area through the dummy gate oxide film. After this, the dummy gate oxide film is removed using a suitable solution such as $NH_4F$ solution. An $SiO_2$ film approximately 100 Å thick acting as a first gate insulating film 4 is formed on the semiconductor substrate 1 by thermal oxidation. On this film, polysilicon is deposited to a thickness of approximately 100 nm by Low Pressure Chemical vapor Deposition (LPCVD) techniques to form a floating gate 5. Impurities are diffused into the polysilicon layer by thermal diffusion using $POCl_3$. Slits are made suitably in the polysilicon layer so that a cell slit may be provided in the floating gate. A multilayer insulating film of $SiO_2/Si_3N_4/SiO_2$ acting as a second gate insulating film 6 is formed on the polysilicon layer. After polysilicon is deposited on the multilayer insulating film to a thickness of approximately 200 nm by LPCVD techniques to form a control gate 6. Impurities are diffused into the polysilicon layer by thermal diffusion using $POCl_3$. Then, using a patterned photoresist, the polysilicon layer and the multilayer insulating film are subjected to anisotropic etching so that the floating gate 5, the second gate insulating film 6, and the control gate 7 are formed sequentially on the first gate insulating film 4.

As shown in FIG. 3, a plurality of multilayer structures, each made up of the floating gate 5, the second gate insulating film 6, and the control gate 7 formed on the first gate insulating film 4, are formed in a direction perpendicular to the field oxide film 12 and the element region 15, at specified intervals. The floating gates 5 are separated from each other for each memory cell by cell slits formed above the field oxide film 12. On the other hand, the control gate 7 is continuous for plural memory cells. By forming a silicide film such as a molybdenum silicide film on the control gate 7, the resistance of the control gate can be decreased. The control gate constitutes a word line as noted earlier.

Next, the semiconductor substrate is heated in an oxidative atmosphere at temperatures lower than 900° C., for example, at temperatures ranging from 800° C. to 850° C., for nearly 40 minutes, to form a thermal oxide film 8 to a thickness of approximately 500 Å all over the surface of the resultant structure. This thickness is a limit because making the thermal oxide film 8 thicker has an adverse effect on the other regions in the thermal processing. Then, as shown in FIG. 5, a patterned photoresist 14 is provided on the thermal oxide film 8 corresponding to the drain formation-scheduled area and a part of the gate.

The source formation scheduled area 15 is not coated with the photoresist 14. The surface of the source formation-scheduled area is etched to expose the surface of the element region of the semiconductor substrate 1 as shown in FIG. 5. In the process of exposing the surface of the semiconductor substrate 1, the surface of the thermal oxide film 8 is first removed approximately 450 Å by RIE. After that, by chemical etching using, e.g., ammonium fluoride, the remaining thermal oxide film approximately 50 Å thick is removed. By doing this, the source formation-scheduled area of the element region 15 can be exposed without damaging the surface of this scheduled area as shown in FIG. 5.

In the above state, as shown in FIG. 6, a tungsten film 19 is selectively grown to a thickness of 100 to 300 Å on the source formation-scheduled area 15 where the semiconductor substrate 1 is exposed. To achieve this, LPCVD using $WF_6$ gas is applied. A material coated over the source formation-scheduled area 15 is not limited to tungsten. For instance, molybdenum may be used.

Figure 7A:
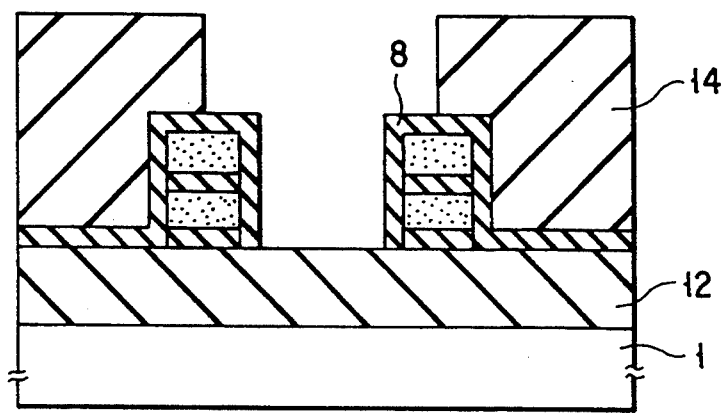
FIG. 7A is a sectional view of the semiconductor memory device along a line 7A to 7A shown in FIG. 6.
Figure 7B:
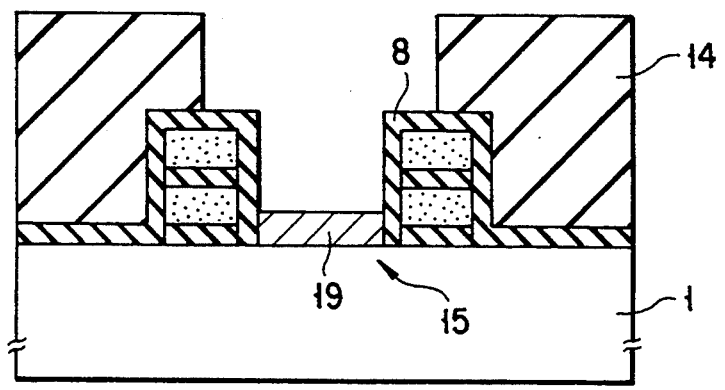
FIG. 7B is a sectional view of the semiconductor memory device along a line 7B to 7B shown in FIG. 6.

FIG. 7A is a sectional view taken along line 7A—7A of FIG. 6, and shows a portion where the field oxide film 12 is coated. FIG. 7B is a sectional view taken along line 7B—7B of FIG. 6, and shows a portion where the tungsten layer 19 is coated. In both portions, the multilayer gates are protected by the thermal oxide film 8.

Figure 8:
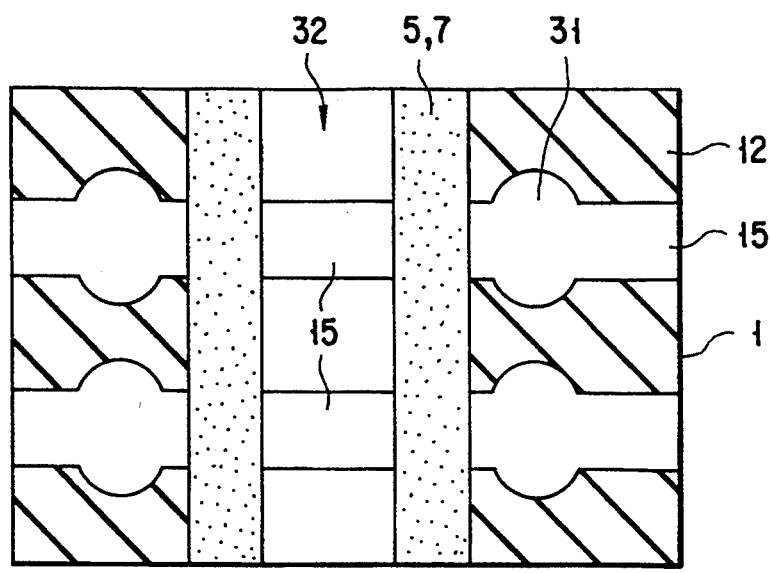
FIG. 8 through FIG. 10 are plan views of the sequence of manufacturing processes for the semiconductor memory device of FIG. 1.

After this, by oxide film RIE, the portion not coated with the photoresist 14 undergoes etching to remove the field oxide film 12 in this portion as shown in FIG. 8. As described earlier, in the portion not coated with the photoresist 14, the field oxide film 12 and a partially silicified tungsten film 19 are provided. Thus, the field oxide film 12 is removed by making use of the difference in etching speed between these two films in oxide film RIE. Specifically, the etching rate of the silicon oxide film is more than 20 times as fast as that of tungsten. If the thickness of the field oxide film 12 is set to approximately 6000 Å and the thickness of the tungsten film 19 is set to approximately 300 Å, the surface of the semiconductor substrate can be exposed without damaging the state of the surface of the semiconductor substrate on which the tungsten film 19 was formed, even after the field oxide film 12 is completely removed. In this example, the photoresist 14 is used in both the process of etching the thermal oxide film 8 and the process of etching the field oxide film. A separate photoresist may be used as a mask in each process.

Figure 9:
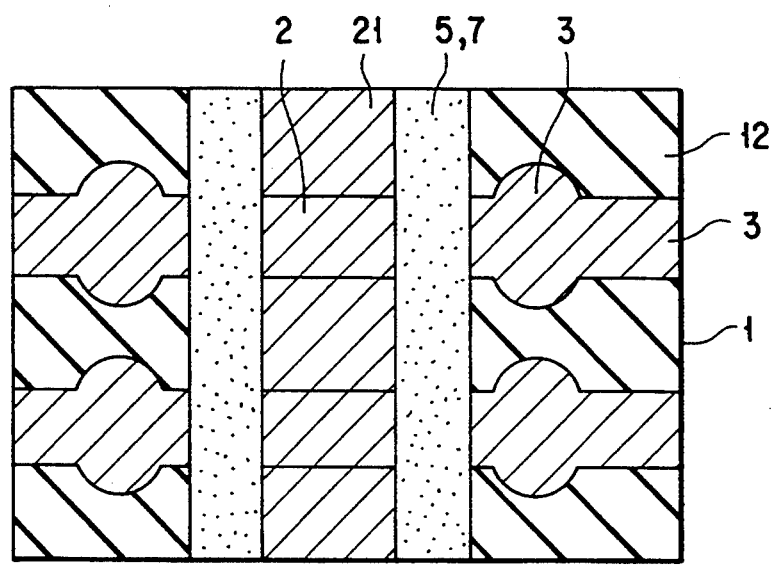

In FIG. 8 and later, the representation of the thermal oxide film 8 in plan views will be omitted. After the surface of the semiconductor substrate 1 is exposed, the photoresist is removed. Then, by thermal oxidation, the surfaces of the gate and the source and drain regions are completely coated with the thermal oxide film 8. After this, using a patterned photoresist (not shown), for example, As ions are implanted at a dose of $5 \times 10^{15}$ cm$^{-2}$ and an acceleration voltage of 40 KeV into the scheduled area 32 in which a common source line 21 containing the source formation-scheduled area 15 is to be formed. Further, P ions are implanted at a dose of $5 \times 10^{13}$ cm$^{-2}$ and an acceleration voltage of 40 KeV into the same area so as to form the source region 2 and the common source region 21 in a self-aligning manner as shown in FIG. 9. Then, by performing thermal processing at approximately 1000° C. for nearly 30 minutes in a nitrogen atmosphere, the impurity ions implanted are diffused.

The ion implantation into the scheduled area 32 for the common source line 21 containing the source formation-scheduled area 15, may be performed before the formation of the thermal oxidation film 8. In this case, implanted impurities are diffused to reach the section below the floating gate. On the contrary, when the ions are implanted into the scheduled area 32 after the formation of the thermal oxidation film 8, implanted impurities may not be diffused to reach the section below the floating gate. Further, the ion implantation into the scheduled area 32 may be performed twice before and after the formation of the thermal oxidation film 8.

Figure 10:
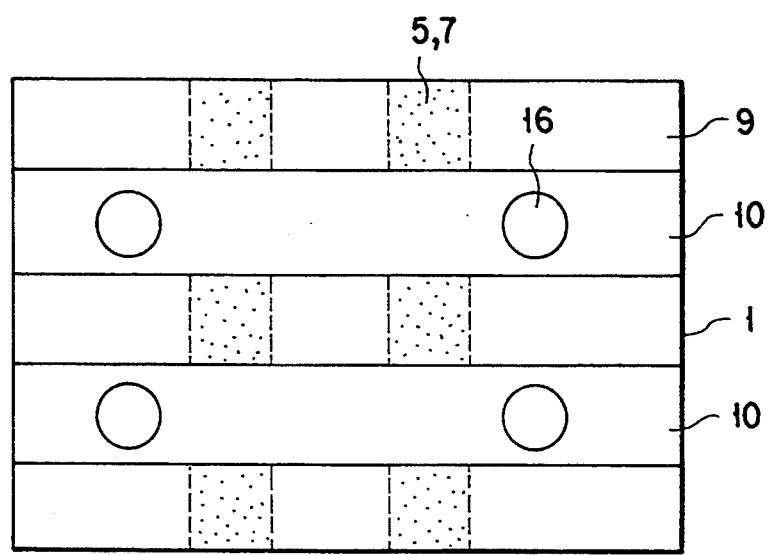

Next, using a patterned photoresist (not shown), for example, As ions are implanted at a dose of $5 \times 10^{15}$ cm$^{-2}$ and an acceleration voltage of 40 KeV into the drain formation scheduled area 31 to form a drain region 3 as shown in FIG. 9. After this, the surface of the resultant structure is coated with an interlayer insulating film 9 such as BPSG as shown in FIG. 10. After a contact hole 16 is formed in a place corresponding to the drain region 3 of the interlayer insulating film 9, a wire 10 is formed of, for example, Al on the interlayer insulating film 9. The wire 10 is connected to the drain region 3 through the contact hole 16. The wire 10 corresponds to bit line B shown in FIG. 13. On the wire 10, a passivation film 11, such as a silicon oxide film or a silicon nitride film, is formed.

By the above manufacturing method, the surface of the source formation-scheduled area 15 contained in the common source line 21 is covered with the tungsten film 19 in the process of removing the field oxide film 12 in forming the common source line 21. Thus, because the surface of the source formation-scheduled area 15 is protected without being etched in oxide film RIE, it stays flush with the surface of the semiconductor substrate 1 under the gate. Thus, the portion from which electrons in the source region 2 formed thereafter is uniform in electric field strength, assuring a stable erasing operation.

In the case of flash EEPROMs, movement of electrons during data erasure occurs in the place where the floating gate overlaps with the source region. It is the area where the source region overlaps with the gate and only very small portions of the source region near the gate ends that have an effect on the erasing operation. Thus, in the source region 2, only the area into which electrons are discharged from the floating gate must be flush with the surface of the semiconductor substrate 1 under the gate. The surfaces of other regions may be rough.

FIGS. 11 and 12 show a second embodiment of the present invention and are sectional views of a flash EEPROM cell, centering around the source region. In FIGS. 11 and 12, the same parts as those in FIGS. 1 through 10 are indicated by the same reference characters.

First, the arrangement of a memory cell formed in this embodiment will be described.

As shown in FIG. 12, a recessed portion 22 is formed in the central portion of the source region 2 so as to be lower than the surface of the semiconductor substrate 1. However, the region 17 where the source region 2 overlaps with the floating gate 5 and the very small area 18 of the source region from the vicinity of an end of the floating gate 5 to the recessed portion 22 are flush with the surface of the semiconductor substrate 1 under the gate. The width Wa of the region 18 is set at approximately 0.1 μm. By forming the region 18, the erasing characteristic of the flash EEPROM cell can be improved.

The processes for forming a source region whose surface shape is as described above, will be explained.

In this embodiment, the processes until the formation of the control gate 7 are the same as those in the first embodiment. After the control gate 7 has been formed, a CVDSiO$_2$ film 20 is deposited to a thickness of approximately 1000 Å on the resultant structure by CVD techniques, as shown in FIG. 11. Then, to form a source region, photoresist for SAS (photoresist 14 shown in FIG. 5) is deposited. Using this photoresist as a mask, oxide film RIE is achieved. As a result, the field oxide film 12 is removed, and at the same time, the CVDSiO$_2$ film 20 on the source region 2 is also etched. Because the CVDSiO$_2$ film 20 deposited on the gate sidewall is as thick as approximately 6000 Å, the surface of the semiconductor substrate 1 under the CVDSiO$_2$ film 20 deposited on the gate sidewall is not etched.

On the other hand, because the thickness of the SiO$_2$ film 20 in the central portion of the source region 2 is approximately 1000 Å, the oxide film RIE gives damage to the semiconductor substrate 1 under the SiO$_2$ film 20 as a result of etching. In the central portion, the recessed portion 22 is formed. After this, the photoresist and the remaining CVDSiO$_2$ film are removed, and a thermal oxide film is formed on the surface of the semiconductor substrate 1 and that of the multilayer gate structure. Then, as in the first embodiment, an interlayer insulating film, a wire, and a passivation film are formed in sequence.

According to this embodiment, a recessed portion is formed in the central portion of the source region. The area corresponding to the recessed portion has no effect on the electrons discharged from the floating gate 5. Thus, even if this area is damaged due to etching, the erasing characteristic will not deteriorate. In this way, the second embodiment can improve the erasing characteristic as compared with conventional equivalents.

What is claimed is:

1. A manufacturing method of semiconductor memory devices, comprising the steps of:
   forming a plurality of field oxide films at intervals in stripes on the surface of a semiconductor substrate so as to arrange field oxide film regions and element regions one after another alternately on the surface of the semiconductor substrate;
   forming a plurality of striped multilayer gate structures in a direction substantially perpendicular to said field oxide film regions, at intervals above said semiconductor substrate, each multilayer gate structure having a first gate insulating film formed on said semiconductor substrate, a floating gate formed on the first gate insulating film, a second gate insulating film formed on the floating gate, and a control gate formed on the second gate insulating film, said floating gate, said second gate insulating film and said control gate being formed on said field oxide film regions and said element regions, thus forming a first structure;
   forming a thermal oxide film on the surface of the first structure;
   coating the element regions except for at least a common-source line formation-scheduled area with a photoresist, said common-source line formation-scheduled area containing source regions;
   etching away said thermal oxide film on said source-region formation-scheduled area so as to expose the semiconductor substrate in said source-region formation-scheduled area;
   selectively growing a protective film on the surface of the semiconductor substrate exposed in said source-region formation-scheduled area, the etching rate of the protective film being lower than the etching rate of the field oxide film regions;
   etching away said protective film and said field oxide film regions on said common-source line formation-scheduled area so as to expose the surface of the semiconductor substrate in said common-source line formation-scheduled area; and
   implanting impurity ions into said common-source line formation-scheduled area in said semiconductor substrate, with said multilayer gate structure as a mask, so as to form common source lines containing source regions in said common-source line formation-scheduled area in a self-aligning manner.

2. A method according to claim 1, wherein the step of etching away said thermal oxide film on said source region formation-scheduled area so as to expose the semiconductor substrate in the source region formation-scheduled area is carried out by first performing RIE and thereafter effecting chemical etching by using ammonium fluoride.

3. A method according to claim 1, wherein said protective film is made of either tungsten or molybdenum.

4. A manufacturing method of semiconductor memory devices, comprising the steps of:
   forming a plurality of field oxide films at intervals in stripes on the surface of a semiconductor substrate so as to arrange field oxide film regions and element regions one after another alternately on the surface of the semiconductor substrate;
   forming a plurality of striped multilayer gate structures in a direction substantially perpendicular to said field oxide film regions, at intervals above said semiconductor substrate, each multilayer gate structure having a first gate insulating film formed on said semiconductor substrate, a floating gate formed on the first gate insulating film, a second gate insulating film formed on the floating gate, and a control gate formed on the second gate insulating film, said first gate insulating film and said floating gate being formed on said element region, and said second gate insulating film and said control gate being formed on said field oxide film regions and said element regions, thus forming a first structure;
   forming an insulating film on the entire first structure, the thickness of the insulating film formed on sidewalls of the first structure being substantially equal to the thickness of said field oxide film regions;
   coating the element regions except for at least a common-source line formation-scheduled area with a photoresist, said common-source line formation-scheduled area containing source regions;
   etching away said field oxide film regions and said insulating film on said common-source line formation-scheduled area so as to expose the surface of the semiconductor substrate in said common-source line formation-scheduled area;
   implanting impurity ions into said common-source line formation-scheduled area in said semiconductor substrate, with said multilayer gate structure as a mask, so as to form common source lines containing source regions in said common-source line formation-scheduled area in a self-aligning manner;
   completely removing said photoresist and said insulating film to form a second structure; and forming a thermal oxide film on the surface of the second structure.

5. A method according to claim 4, wherein said insulating film is a SiO$_2$ film formed by CVD.

6. A manufacturing method of semiconductor memory devices, comprising the steps of:

forming a plurality of field oxide films at intervals in stripes on the surface of a semiconductor substrate so as to arrange field oxide film regions and element regions one after another alternately on the surface of the semiconductor substrate;

forming a plurality of striped multilayer gate structures in a direction substantially perpendicular to said field oxide film regions, at intervals above said semiconductor substrate, each multilayer gate structure having a first gate insulating film formed on said semiconductor substrate, a floating gate formed on the first gate insulating film, a second gate insulating film formed on the floating gate, and a control gate formed on the second gate insulating film, said floating gate, said second gate insulating film and said control gate being formed on said field oxide film regions and said element regions, thus forming a first structure;

forming a thermal oxide film on the entire first structure;

implanting impurity ions into a common-source line formation-scheduled area in said semiconductor substrate, with said multilayer gate structure as a mask, so as to form common source lines containing source regions in said common-source line formation-scheduled area in a self-aligning manner;

coating the element regions except for at least said common-source line formation-scheduled area with a photoresist, said common-source line formation-scheduled area containing source-regions;

etching away said thermal oxide film formed on the entire first structure to expose the semiconductor substrate in said source-region formation-scheduled area;

selectively growing a protective film on the surface of the semiconductor substrate exposed in said source-region formation-scheduled area, the etching rate of the protective film being lower than the etching rate of the field oxide film regions; and etching away said protective film and said field oxide film regions on said common-source line formation-scheduled area so as to expose the surface of the semiconductor substrate in said common-source line formation-scheduled area.

7. A manufacturing method of semiconductor memory devices, comprising the steps of:

forming a plurality of field oxide films at intervals in stripes on the surface of a semiconductor substrate so as to arrange field oxide film regions and element regions one after another alternately on the surface of the semiconductor substrate;

forming a plurality of striped multilayer gate structures in a direction substantially perpendicular to said field oxide film, at specified intervals above said semiconductor substrate, each multilayer gate structure having a first gate insulating film formed on said semiconductor substrate, a floating gate formed on the first gate insulating film, a second gate insulating film formed on the floating gate, and a control gate formed on the second gate insulating film, said first gate insulating film and said floating gate being formed on said element region, and said second gate insulating film and said control gate being formed on said field oxide film and said element region;

implanting impurity ions into a common-source line formation-scheduled area in said semiconductor substrate, with said multilayer gate structure as a mask, so as to form common source lines containing source regions in said common-source line formation-scheduled area in a self-aligning manner, thus forming a first structure;

forming an insulating film on the first structure, the thickness of the insulating film formed on sidewalls of the first structure being set substantially equal to the thickness of said field oxide film regions;

coating the element regions except for at least said common-source line formation-scheduled area with a photoresist, said common-source line formation-scheduled area containing source regions;

etching away said field oxide film and said insulating film on said common-source line formation-scheduled area so as to expose the surface of the semiconductor substrate in said common-source line formation-scheduled area;

completely removing said photoresist and said insulating film to form a second structure; and forming a thermal oxide film on the surface of the second structure.

8. A manufacturing method of semiconductor memory devices, comprising the steps of:

forming a plurality of field oxide films at intervals in stripes on the surface of a semiconductor substrate so as to arrange field oxide film regions and element regions one after another alternately on the surface of the semiconductor substrate;

forming a plurality of striped multilayer gate structures in a direction substantially perpendicular to said field oxide film regions, at intervals above said semiconductor substrate, each multilayer gate structure having a first gate insulating film formed on said semiconductor substrate, a floating gate formed on the first gate insulating film, a second gate insulating film formed on the floating gate, and a control gate formed on the second gate insulating film, said first gate insulating film and said floating gate being formed on said element region, and said second gate insulating film and said control gate being formed on said field oxide film regions and said element regions, thus forming a first structure;

forming an insulating film on the first structure, the thickness of the insulating film formed on sidewalls of the first structure being substantially equal to the thickness of said field oxide film regions;

coating the element regions except for at least a common-source line formation-scheduled area with a photoresist, said common-source line formation-scheduled area containing source regions;

etching away said field oxide film regions and said insulating film on said common-source line formation-scheduled area so as to expose the surface of the semiconductor substrate in said common-source line formation-scheduled area;

implanting impurity ions into said common-source line formation-scheduled area in said semiconductor substrate, with said multilayer gate structure as a mask, so as to form common source lines containing source regions in said common-source line formation-scheduled area in a self-aligning manner;

completely removing said photoresist, thus forming a second structure; and forming an insulating film on the surface of the second structure after said photoresist is completely removed.

9. A manufacturing method of semiconductor memory devices, comprising the steps of:

forming a plurality of field oxide films at intervals in stripes on the surface of a semiconductor substrate so as to arrange field oxide film regions and element regions one after another alternately on the surface of the semiconductor substrate;

forming a plurality of striped multilayer gate structures in a direction substantially perpendicular to said field oxide film, at specified intervals above said semiconductor substrate, each multilayer gate structure having a first gate insulating film formed on said semiconductor substrate, a floating gate formed on the first gate insulating film, a second gate insulating film formed on the floating gate, and a control formed on the second gate insulating film, said first gate insulating film and said floating gate being formed on said element region, and said second gate insulating film and said control gate being formed on said field oxide film and said element region;

implanting impurity ions into a common-source line formation-scheduled area in said semiconductor substrate, with said multilayer gate structure as a mask, so as to form common source lines containing source regions in said common-source line formation-scheduled area in a self-aligning manner, thus forming a first structure;

forming an insulating film on the first structure, the thickness of the insulating film formed on sidewalls of the first structure being set substantially equal to the thickness of said field oxide film regions;

coating the element regions except for at least said common-source line formation-scheduled area with a photoresist, said common-source line formation-scheduled area containing source regions;

etching away said field oxide film and said insulating film on said common-source line formation-scheduled area so as to expose the surface of the semiconductor substrate in said common-source line formation-scheduled area;

completely removing said photoresist, thus forming a second structure; and forming an insulating film on the surface of the second structure after said photoresist is completely removed.

* * * * *